US012640353B2

(12) United States Patent
Schmid et al.

(10) Patent No.: US 12,640,353 B2
(45) Date of Patent: May 26, 2026

(54) WAFER EDGE PROFILE CONTROL USING CONNECTED EDGE RING HARDWARE

(71) Applicant: Applied Materials, Inc., Santa Clara, CA (US)

(72) Inventors: Andreas Schmid, Meyriez (CH); Sahiti Nallagonda, Santa Clara, CA (US); Peter Muraoka, Santa Clara, CA (US); Michael T. Nichols, Sunnyvale, CA (US); Denis Martin Koosau, Sunnyvale, CA (US); Stephen D. Prouty, San Jose, CA (US); Sunil Srinivasan, San Jose, CA (US); Pranav Badole, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 511 days.

(21) Appl. No.: 18/218,579

(22) Filed: Jul. 5, 2023

(65) Prior Publication Data

US 2025/0014878 A1     Jan. 9, 2025

(51) Int. Cl.
*H01J 37/34* (2006.01)

(52) U.S. Cl.
CPC ........ *H01J 37/3435* (2013.01); *H01J 37/347* (2013.01); *H01J 2237/2007* (2013.01); *H01J 2237/3323* (2013.01)

(58) Field of Classification Search
CPC ................. H01J 37/3435; H01J 37/347; H01J 2237/2007; H01J 2237/3323; H01J 37/32642
See application file for complete search history.

(56) References Cited

U.S. PATENT DOCUMENTS

| | | | |
|---|---|---|---|
| 10,600,623 B2 * | 3/2020 | Sarode Vishwanath ..................... | H01J 37/32522 |
| 10,991,556 B2 | 4/2021 | Luere et al. | |
| 11,043,400 B2 * | 6/2021 | Schmid ............ | H01L 21/67063 |
| 2008/0241420 A1 | 10/2008 | Dhindsa et al. | |
| 2020/0227238 A1 | 7/2020 | Kellogg et al. | |

(Continued)

FOREIGN PATENT DOCUMENTS

| | | | | | |
|---|---|---|---|---|---|
| KR | 20180099776 A | * | 9/2018 | ....... | H01L 21/68742 |

OTHER PUBLICATIONS

International Search Report and Written Opinion for Application No. PCT/US2024/029804 dated Sep. 5, 2024.

*Primary Examiner* — Jeffrie R Lund
(74) *Attorney, Agent, or Firm* — Patterson + Sheridan, LLP

(57) ABSTRACT

Embodiments described herein generally related to a substrate processing apparatus. In one embodiment, a process kit for a substrate processing chamber disclosed herein. The process kit includes a ring having a first ring component and a second ring component, a sliding ring, and an actuating mechanism. The first ring component is interfaced with the second ring component such that the second ring component is movable relative to the first ring component forming a gap therebetween. The sliding ring is positioned beneath the ring and contacts a bottom surface of the second ring component. A top surface of the sliding ring contacts the second ring component. The actuating mechanism is interfaced with the bottom surface of the sliding ring. The actuating mechanism is configured to actuate the sliding ring such that the gap between the first ring component and the second ring component varies.

20 Claims, 8 Drawing Sheets

(56)                    References Cited

U.S. PATENT DOCUMENTS

| | | | |
|---|---|---|---|
| 2020/0234981 A1 | 7/2020 | Schmid et al. | |
| 2021/0013014 A1 | 1/2021 | Sarode Vishwanath | |
| 2021/0043431 A1 | 2/2021 | Bin Budiman et al. | |
| 2022/0319811 A1 | 10/2022 | Cui et al. | |
| 2022/0367158 A1 | 11/2022 | Cui et al. | |
| 2024/0429089 A1* | 12/2024 | Muraoka | H01L 21/68721 |
| 2025/0014878 A1* | 1/2025 | Schmid | H01J 37/3435 |
| 2025/0246415 A1* | 7/2025 | Dash | H01J 37/32642 |

* cited by examiner

WAFER EDGE PROFILE CONTROL USING CONNECTED EDGE RING HARDWARE

BACKGROUND

Field

Embodiments described herein generally relate to a substrate processing apparatus, and more specifically to an improved apparatus for controlling a plasma edge profile for processing substrates.

Description of the Related Art

As semiconductor technology nodes advanced with reduced size device geometries, substrate edge critical dimension uniformity requirements become more stringent and affect die yields. Commercial plasma reactors include multiple tunable knobs for controlling process uniformity across a substrate, such as, for example, temperature, gas flow, direct current (DC) power, and the like. Typically, in etch processes, silicon substrates are etched while electrostatically clamped to an electrostatic chuck.

During processing, a substrate resting on a substrate support may undergo a process that deposits material on the substrate and to remove, or etch, portions of the material from the substrate, often in succession or in alternating processes. It is typically beneficial to have uniform deposition and etching rates across the surface of the substrate. However, process non-uniformities often exist across the surface of the substrate and may be significant at the perimeter or edge of the substrate. These non-uniformities at the perimeter may be attributable to electric field termination affects and are sometimes referred to as edge effects. During deposition or etching, a process kit containing at least a deposition ring is sometimes provided to favorably influence uniformity at the substrate perimeter or edge.

Conventional process kits have relied on radio frequency (RF) coupling to control the edge profile of the plasma while processing. However, newer processing capabilities are being expanded with DC generators for controlling the plasma profile. It has been found that the DC circuit does not couple to the edge of the substrate support in the same manner as RF circuits. Thus, newer processing equipment has a poor edge response to control profile and tuning of the plasma for substrate processing.

Accordingly, there is a continual need for an improved apparatus for a substrate processing.

SUMMARY

Embodiments described herein generally related to a substrate processing apparatus, process kit and methods for using the same. In one example, a process kit for a substrate processing chamber disclosed herein. The process kit includes an edge ring, a sliding ring, an actuating mechanism, and a power coupling mechanism. The edge ring configured to circumscribe a substrate in a semiconductor processing chamber. The sliding ring positioned beneath the edge ring, the sliding ring having a top surface configured to contact a bottom surface of the edge ring. The actuating mechanism interfaced with a bottom surface of the sliding ring, the actuating mechanism configured to move the sliding ring such that the edge ring may me moved. The power coupling mechanism electromechanically coupled to the sliding ring and configured to electro mechanically couple to a cathode providing DC power.

In another example, a processing chamber is disclosed herein. The processing chamber includes a substrate support member and a process kit. The substrate support member is configured to support a substrate. The substrate support member having a cathode coupled to a DC power supply. The process kit is supported by the substrate support member. The process kit includes an edge ring, a sliding ring, an actuating mechanism, and a power coupling mechanism. The edge ring configured to circumscribe a substrate in a semiconductor processing chamber. The sliding ring positioned beneath the edge ring, the sliding ring having a top surface configured to contact a bottom surface of the edge ring. The actuating mechanism interfaced with a bottom surface of the sliding ring, the actuating mechanism configured to move the sliding ring such that the edge ring may me moved. The power coupling mechanism electromechanically coupled to the sliding ring and configured to electro mechanically couple to the cathode providing DC power.

In another example, a method of processing a substrate is disclosed herein. The substrate is positioned on a substrate support member disposed in a substrate processing chamber. A plasma is created above a substrate. A height of a component of an edge ring is adjusted by actuating a sliding ring interfaced with the component to change a direction of ions at an edge of the substrate. DC power is supplied to the edge ring through the sliding ring which is electro mechanically coupled to a cathode in the substrate support member.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments of the disclosure generally include methods and apparatuses that improve the etch rate uniformity across a surface of a substrate by controlling the shape of a plasma sheath formed across a substrate, such as a semiconductor wafer, during plasma processing. Embodiments of the disclosure will include the adjustment of one or more plasma processing variables and/or the adjustment of the configuration of process kit hardware that is in close proximity to a substrate and/or supports the substrate during processing. Thus, the uniformity of the plasma sheath across the wafer surface can be controlled, thereby increasing wafer processing yield.

More specifically, the disclosure herein includes a processing chamber configuration that includes a cathode assembly that includes a cathode plate that has a threaded connection to an anodized aluminum block that is coupled to a sliding ring that is configured enable the biasing of an edge ring during processing, which can be used to adjust the shape of a plasma sheath formed across a substrate. The block is connected to the sliding ring by a metal strap/spring contact that allows the sliding ring 150 to have a desired range of motion during processing by use of an actuating assembly 151. In addition to this, a top face of the sliding ring, which is electrically conductive, can include a plurality of pins. In one example, three silicon carbide (SiC) pins extend above the sliding ring and are configured to make a direct physical and electrical contact with an edge ring that is disposed thereover. Alternatively, the top of the sliding ring may have a surface that includes a bare metal or a thin layer of anodization that provides a desirable contact with the edge ring that improves DC conductivity between the surface of the sliding ring and a surface of the edge ring. Thus, the new cathode configuration enables improved source power delivery to the moveable edge ring through the cathode assembly.

Processing System Example

Figure 1A:
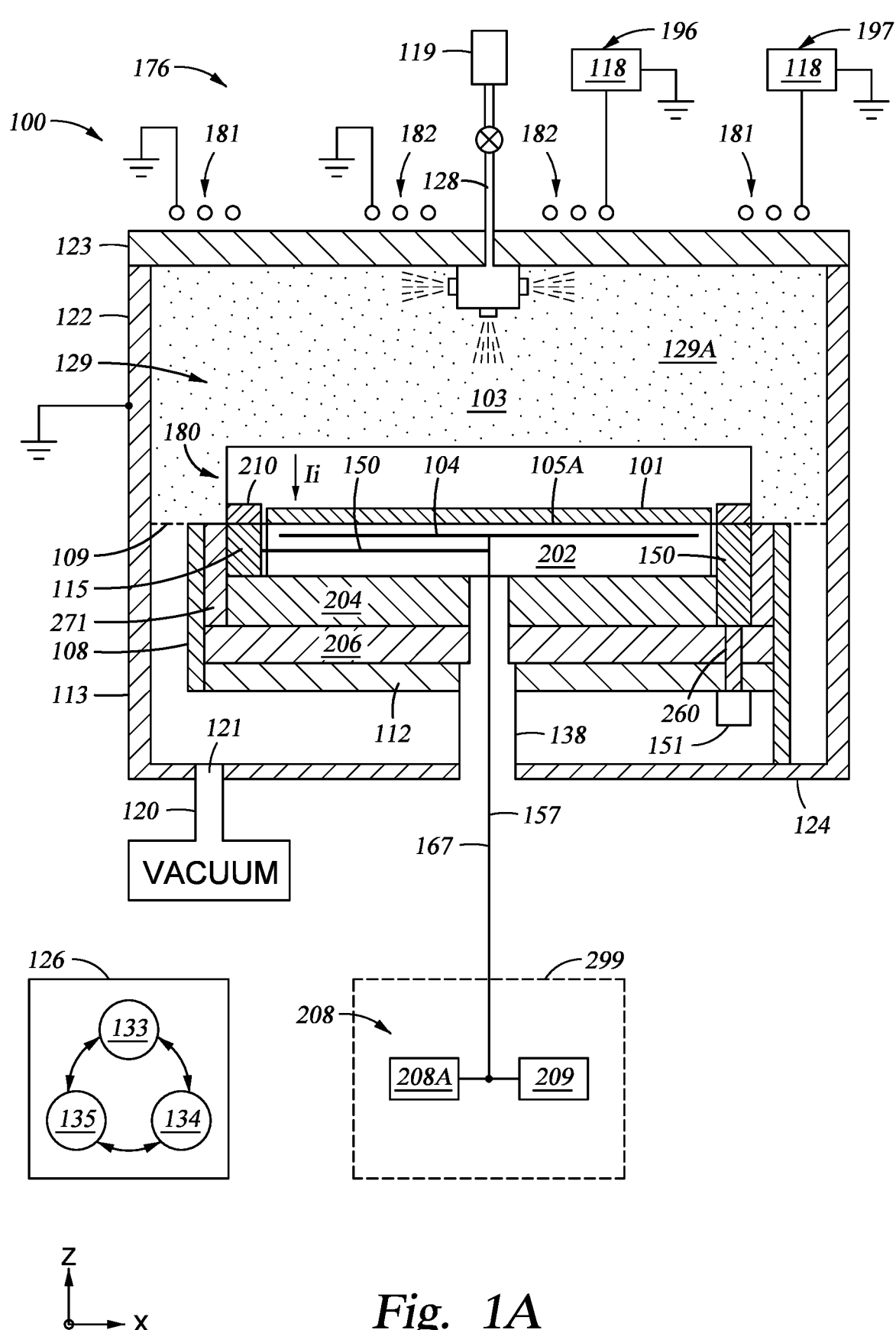
FIG. 1A is a cross sectional view of a processing chamber, according to one embodiment.

FIG. 1A is a cross sectional view of a processing chamber 100 having a sliding ring 150, according to one embodiment. As shown, the processing chamber 100 is an etch chamber suitable for etching a substrate, such as substrate 101. Examples of processing chambers that may be adapted to benefit from the disclosure are Sym3® Processing Chamber, and Mesa™ Processing Chamber, commercially available from Applied Materials, Inc., located in Santa Clara, California. It is contemplated that other processing chamber, including deposition chambers and those from other manufacturers, may be adapted to benefit from the disclosure.

The processing chamber 100 may be used for various plasma processes. In one embodiment, the processing chamber 100 may be used to perform dry etching with one or more etching agents. In one example, a plasma is formed in the processing chamber from a processing gas, such as $C_xF_y$ (where x and y can be different allowed combinations), $O_2$, $NF_3$, or combinations thereof.

The processing chamber 100 has a chamber body 113 and a system controller 126. The chamber body 113 includes a lid assembly 176, a support assembly 136 one or more sidewalls 122 and a chamber base 124, which collectively, with a chamber lid 123 of the lid assembly 176, define the processing volume 129. A substrate support assembly 180 is disposed in the processing volume 129.

The lid assembly 176 includes the chamber lid 123 and one or more plasma source assemblies, such as two inductively coupled plasma (ICP) assemblies 196, 197. Each ICP assembly 196, 197 includes a coil 181, 182, respectively, that is configured to inductively couple a radio frequency (RF) waveform generated by a RF generator 118 to a plasma 103 formed in the processing volume 129 of the processing chamber 100 during plasma processing. In this configuration, the chamber lid 123 includes a dielectric material that is configured to allow the fields generated by the coils 181, 182 during the delivery of an asymmetric voltage waveform by the RF generator 118 to help generate and sustain the plasma 103 in the processing volume 129.

The one or more sidewalls 122 and chamber base 124 generally include materials that are sized and shaped to form the structural support for the elements of the processing chamber 100 and are configured to withstand the pressures and added energy applied to them while the plasma 103 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 is disposed through the chamber lid 123. The gas inlet 128 is used to deliver one or more processing gases to the processing volume 129 from a processing gas source 119 that is in fluid communication therewith. A substrate 101 is loaded into, and removed from, the processing volume 129 through an opening (not shown) in one of the one or more sidewalls 122, which is sealed with a slit valve (not shown) during plasma processing of the substrate 101.

A vacuum system 120 is coupled to the vacuum port 121. The vacuum system 120 may include a vacuum pump and a throttle valve (not shown). The throttle valve regulates the flow of gases through the processing chamber 100. The vacuum pump is coupled to the vacuum port 121 disposed in the interior volume 108 to vacate gases through the vacuum port from the processing chamber 100.

The substrate support assembly 180, disposed in the processing volume 129, is configured to support the substrate 101 for processing. The substrate support assembly 180 may be coupled to a lift mechanism (not shown) through a shaft 138 which extends through the chamber base 124 of the chamber body 113. The lift mechanism may be flexibly sealed to the chamber body 113 by a bellows that prevents vacuum leakage from around the shaft 138. The lift mechanism allows the substrate support assembly 180 to be moved vertically within the chamber body 113 between a lower transfer portion and a number of raised process positions.

One or more lift pins (not shown) may be disposed through the substrate support assembly 180. The three or more lift pins are configured to extend through the substrate support assembly 180 such that the substrate 101 may be raised off a substrate supporting surface 105A of the substrate support assembly 180. The three or more lift pins may be activated by a lift ring (not shown) that is coupled to a lift ring actuator (not shown) that is configured to raise and lower the lift ring and three or more lift pins relative to the substrate supporting surface 105A.

The substrate support assembly 180 includes a substrate support 202 (e.g., ESC substrate support) and one or more lower electrodes, which are coupled to a plasma source, such as a capacitively coupled plasma (CCP) assemblies. Typically, the substrate support 202 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 202 further includes a bias electrode 104 embedded in the dielectric material thereof.

The substrate support assembly 180 can additionally include a cooling plate 204, a base 206 and a ground plate 112. The cooling plate 204 is electrically isolated from the chamber base 124 by the base 206, and the ground plate 112 is interposed between the base 206 and the chamber base 124. The substrate support 202 is thermally coupled to and disposed on the cooling plate 204. In some embodiments, the cooling plate 204 is configured to regulate the temperature of the substrate support 202, and the substrate 101 disposed on the substrate support 202, during substrate processing. In some embodiments, the cooling plate 204 is disposed on the base 206. The cooling plate 204 may include a plurality of cooling channels (not shown) for circulating coolant therethrough. The cooling plate 204 may be coupled to or engaged with the substrate support 202 by an adhesive or any suitable mechanism.

The substrate support assembly 180 includes a process kit 200 supported on the substrate support assembly 180. The process kit 200 includes an edge ring 210, a support ring 214 (Shown in FIGS. 1B and 2), an outer ring 274 (Shown in FIG. 1B) and a sliding ring 150. The support ring 214 and the edge ring 210 are interfaced with each other such that edge ring 210 may be movable relative to support ring 214. The sliding ring 150 is positioned to move the edge ring 210 vertically up and down relative to the support ring 214. An actuating assembly 151 is coupled to and disposed below the sliding ring 150. The actuating assembly 151 may consist of pins, such as three pins, coupled to a linear actuator, such that the pins contact an underside of the sliding ring 150 to move the sliding ring up and down. In one example, the actuating assembly 151 consists of three actuators which work in together to elevate and lower the sliding ring 150. The vertical movement of the sliding ring 150 is imparted on the edge ring 210 through contact between the sliding ring 150 and the edge ring 210 to move the edge ring up and down.

Figure 1B:
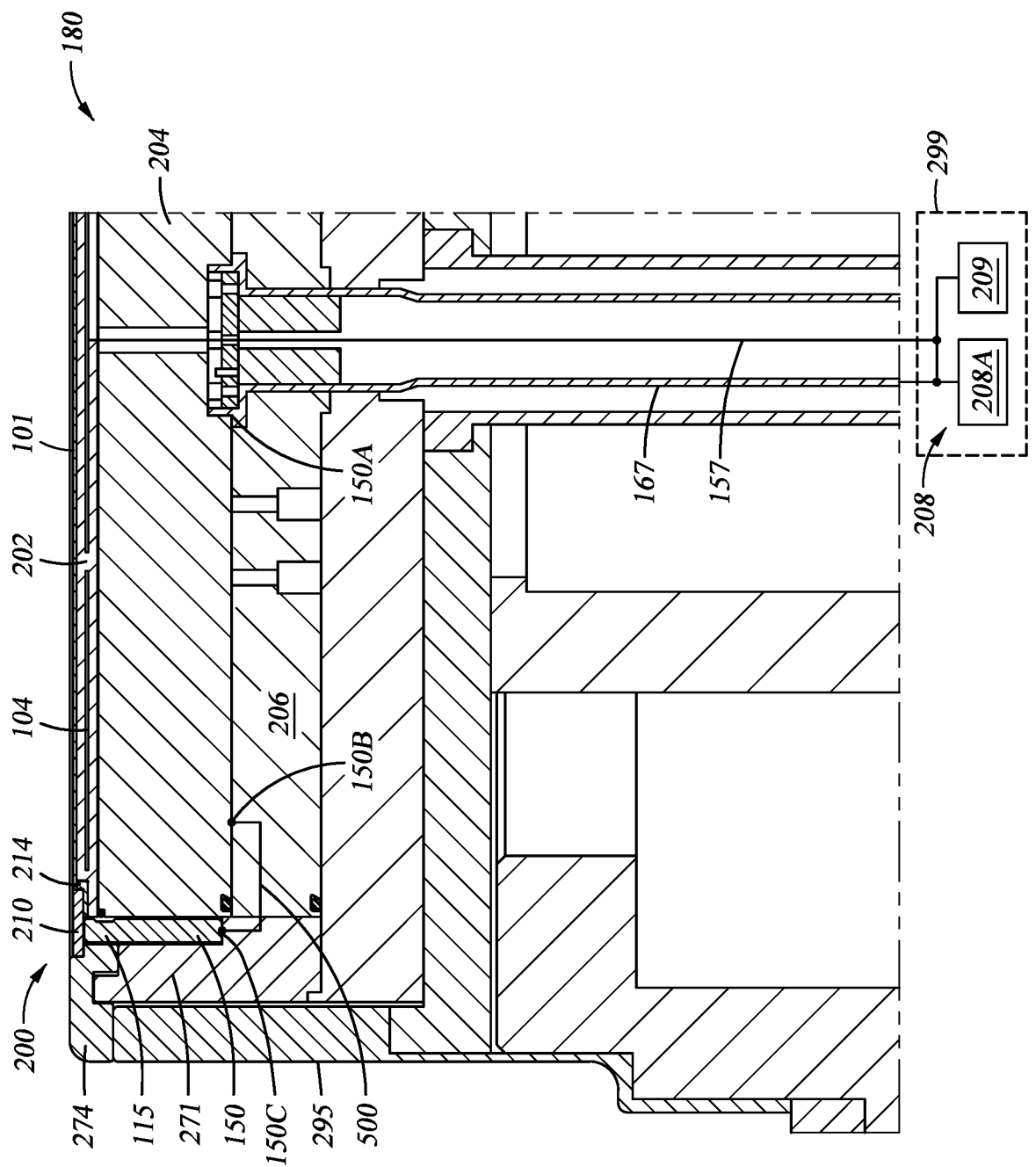
FIG. 1B is enlarged partial cross sectional view of a portion of the support member of FIG. 1A, according to one embodiment.

Turning additionally to FIG. 1B, FIG. 1B is an enlarged partial cross sectional view of the support member of FIG. 1A illustrating the power coupling mechanism 500, according to one embodiment. The processing chamber 100 may include a biasing assembly 299 that can include one or more plasma source assemblies that are each adapted to deliver an asymmetric voltage waveform to one or more electrodes and/or one or more coils disposed within the processing chamber 100. The one or more lower electrodes can include a bias electrode 104 and/or an edge electrode 115 that are disposed within the process kit 200, and are coupled to one or more plasma source assemblies, such as a waveform generation assembly. A first waveform generation assembly 208 may be coupled by a transmission line 157 to the bias electrode 104. In some embodiments, the first waveform generation assembly 208 is also electrically coupled through a conductive tube 167 to the edge electrode 115, which, as described further below, can include a sliding ring 150. The waveform generation assembly 208 is configured to deliver a PV waveform generated by a PV waveform generator, such as PV waveform generator 208A to the plasma 103 formed in the processing volume 129 of the processing chamber 100 during plasma processing. In one embodiment, the first PV waveform generator 208A of the first waveform generation assembly 208 is configured to bias both the bias electrode 104 and the edge electrode 115.

The PV waveform generator 208A is configured to deliver a plurality of asymmetric pulsed voltage waveforms to one or more electrodes within a plasma processing chamber to control and sustain a plasma formed in a processing region and/or control the formation of a sheath over the surface of a substrate during processing. The plasma processing methods and apparatus described herein are configured to improve the control of various characteristics of the generated plasma and control an ion energy distribution (IED) of the plasma generated ions that interact with one or more regions of a surface of a substrate during plasma processing. The ability to synchronize and control waveform characteristics, such as frequency, waveform shape and applied voltage on-time during a voltage waveform pulse provided in each of the pulsed voltage waveforms applied to the electrodes allows for an improved control of the generated plasma. As a result, greater precision for plasma processing can be achieved, which is described herein in more detail.

Figure 1C:
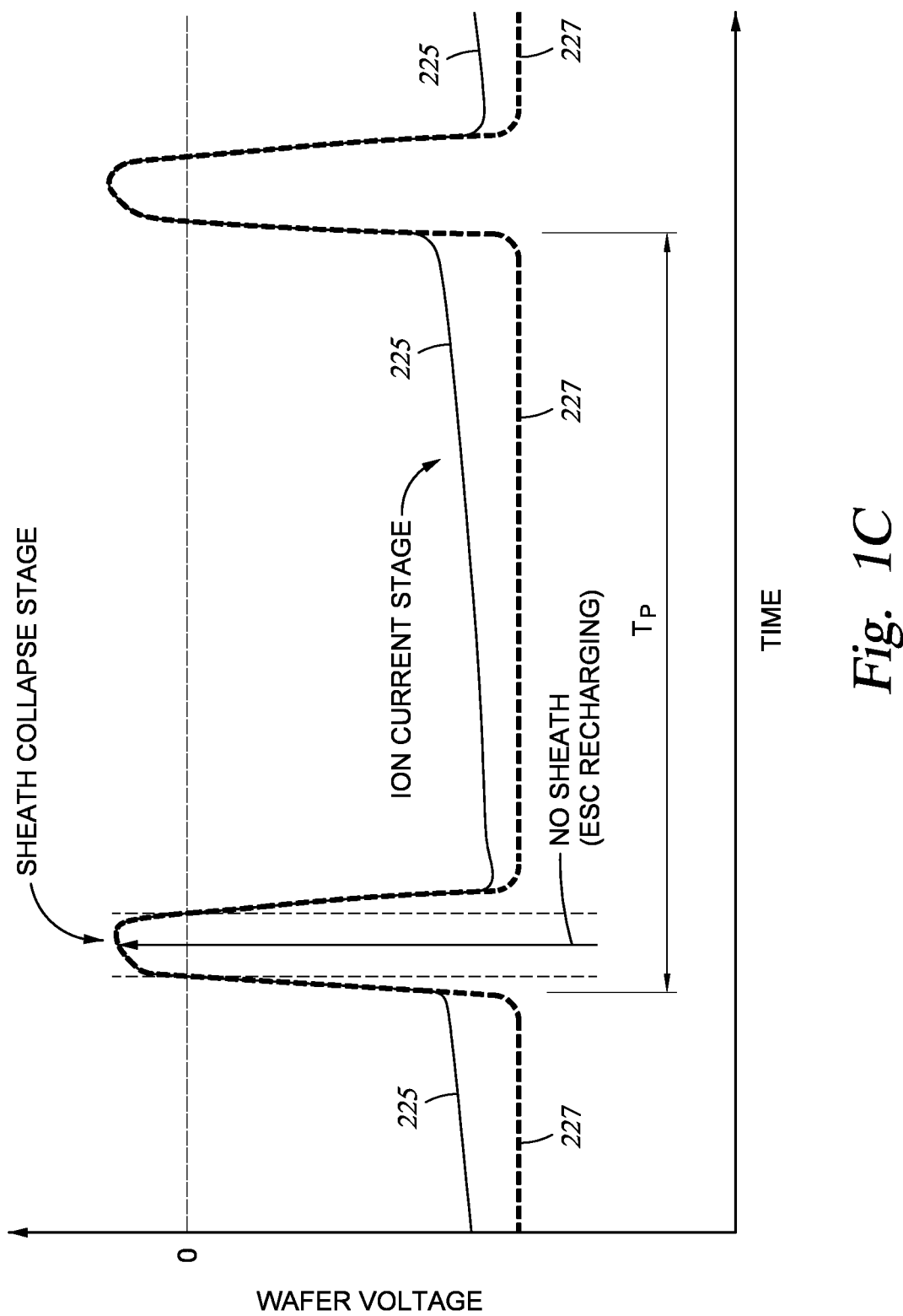
FIG. 1C illustrates a voltage waveform that is established on a substrate due to a voltage waveform applied to an electrode of a processing chamber, in accordance with certain embodiments of the present disclosure.

FIG. 1C illustrates two separate voltage waveforms established at the substrate 101 disposed on the substrate supporting surface 105A of the substrate support assembly 180 of the processing chamber 100 due to the delivery of PV waveforms to the bias electrode 104 of the processing chamber 100. A first waveform (e.g., a waveform 225) is an example of a non-compensated PV waveform established at the substrate 101 during the plasma processing. A second waveform (e.g., a waveform 227) is an example of a compensated PV waveform established at the substrate 101 by applying a negative slope waveform to the bias electrode 104 of the processing chamber 100 during an "ion current stage" portion of the PV waveform cycle by use of the current source (not shown). The compensated PV waveform can alternatively be established by applying a negative voltage ramp during the ion current stage of the PV waveform generated by the PV waveform generator 208A.

The waveforms 225 and 227 include two main stages: an ion current stage and a sheath collapse stage. Both portions (e.g., the ion current stage and the sheath collapse stage) of the waveforms 225 and 227, can be alternately and/or separately established at the substrate 101 during the plasma processing. At a beginning of the ion current stage, a drop in the voltage at the substrate 101 is created, due to the delivery of a negative portion of the PV waveform (e.g., the ion current portion) provided to the bias electrode 104 by the PV waveform generator 208A, which creates a high voltage sheath above the substrate 101. The high voltage sheath allows the plasma generated positive ions to be accelerated towards the biased substrate 101 during the ion current stage, and thus, for RIE processes, controls the amount and characteristics of the etching process that occurs on the surface of the substrate 101 during the plasma processing. In some embodiments, it is desirable for the ion current stage to include a region of the PV waveform that achieves the voltage at the substrate 101 that is stable or minimally varying throughout the stage, as illustrated in FIG. 1C by the waveform 227. One will note that significant variations in the voltage established at the substrate 101 during the ion current stage, such as shown by the positive slope in the waveform 225, will undesirably cause a variation in the ion energy distribution (IED) and thus cause undesirable characteristics of the etched features to be formed in the substrate 101 during the RIE process.

Returning to FIGS. 1A and 1B, in one configuration, the bias electrode 104 is also used as a chucking pole used to secure (i.e., chuck) the substrate 101 to the substrate supporting surface 105A of the substrate support 202 and also to bias the substrate 101 with respect to the plasma 103 using one or more of the voltage waveform biasing schemes described herein. Typically, the bias electrode 104 is formed of one or more electrically conductive parts, such as one or more metal meshes, foils, plates, or combinations thereof.

The biasing assembly 299 may also include a clamping network 209 so that a high voltage bias applied to the bias electrode 104 and/or edge electrode 115. In some embodiments, the bias electrode 104 is electrically coupled to a clamping network 209 and the edge electrode 115 is electrically coupled to a separate clamping network (not shown). The clamping network, by use of high voltage DC power source, provides a chucking voltage to the bias electrode 104 and/or edge electrode 115, such as static DC voltage between about −5000 V and about +5000 V.

In some embodiments, the edge electrode 115 is positioned below the edge of the substrate and is disposed a distance from a center of the bias electrode 104. In general, for a processing chamber 100 that is configured to process circular substrates, the edge electrode 115 is annular in shape, is made from a conductive material, and is configured to surround at least a portion of the bias electrode 104. In some embodiments, the edge electrode 115 is configured to surround at least a portion of the bias electrode 104 when viewed in a direction normal to the substrate supporting surface 105A. In one embodiment, the sliding ring 150 is positioned below the edge ring 210. In another embodiment, the sliding ring 150 includes a plurality of connected structures (e.g., pins, arc segments, etc.) that are configured to contact and support the edge ring 210.

During operation, traditionally a PV waveform generator 208A is configured to provide a PV waveform to the chucking mesh (e.g., bias electrode 104) on substrate support 202. Unfortunately, the delivery of the PV waveform to the bias electrode 104 is typically weakly DC coupled to the edge electrode 115. Thus, in some embodiments, the process chamber 100 includes a biasing assembly 299 that is configured to provide improved delivery of a PV waveform to at least the electrodes disposed within the process kit 200, such as the bias electrode 104 and sliding ring 150. In some configurations, the biasing assembly 299 is provided to overcome the weak DC coupling to the electrodes present in a plasma processing system.

In some embodiments of the biasing assembly 299, and in an effort supply a PV waveform to the edge electrode 115, the PV waveform generator 208A is electrically coupled to the cooling plate 204 through the conductive tube 167 that is electrically coupled to an output of the PV waveform generator 208A. In general, the PV waveform generator 208A is a voltage waveform generating power supply that is used to control the sheath formation over the surface of the substrate during plasma processing.

During processing, the PV waveform generator 208A of the biasing assembly 299 sends the voltage waveform, such as pulsed voltage waveform, to both the bias electrode 104 in the substrate support 202 and the cooling plate 204 simultaneously. The cooling plate 204 has an electro-mechanical coupling through the power coupling mechanism 500 (e.g., schematically shown in FIG. 1B) that is configured to provide the voltage waveform to edge electrode 115, which can include the sliding ring 150. The power coupling mechanism 500 can include an electrically conductive cable, wire, strap or other flexible element that is configured to transfer the generated voltage waveform provided from the PV waveform generator 208A to a component within the edge electrode 115. In one embodiment, the power coupling mechanism 500 includes a first end 150B that is coupled to the conductive tube 167 through a portion of the cooling plate 204, a second end 150C that is coupled to the a portion of the edge electrode 115 (e.g., sliding ring 150), and a central section that is disposed within a channel (not shown) formed within the cooling plate 204 and/or base 206. In another embodiment, the power coupling mechanism 500 includes a first end 150B that is coupled to the conductive tube 167 through a portion of the base 206, a second end 150C that is coupled to the a portion of the edge electrode 115 (e.g., sliding ring 150), and a central section that is disposed within a channel (not shown) formed within the cooling plate 204 and/or base 206. The channel and central section of the power coupling mechanism 500 are configured to allow movement (e.g., bending, translation, etc.) of the power coupling mechanism 500 as the sliding ring 150 is moved relative to the substrate supporting surface 105A by use of the actuating assembly 151 (FIG. 1A). In yet another embodiment, the power coupling mechanism 500 includes a first end 150B that is directly coupled to the conductive tube 167, a second end 150C that is coupled to the a portion of the edge electrode 115 (e.g., sliding ring 150), and a central section that is disposed within a channel (not shown) formed within the cooling plate 204 and/or base 206. The channel and central section of the power coupling mechanism 500 are configured to allow movement (e.g., bending, translation, etc.) of the power coupling mechanism 500 as the sliding ring 150 is moved relative to the substrate supporting surface 105A by use of the actuating assembly 151 (FIG. 1A).

As schematically illustrated in FIG. 1B, the clamping network 209 can be coupled to the biasing electrode 104 through the transmission line 157, and coupled to the edge electrode 115 through the power coupling mechanism 500, portion of the cooling plate 204, or portion of the base 206, and conductive tube 167.

As shown in FIG. 1A, the system controller 126, also referred to herein as a processing chamber controller, operates to control the operations of processing system 100. For example, the system controller 126 may control the operations of the biasing assembly 299. The system controller 126 includes a central processing unit (CPU) 133, a memory 134, and support circuits 135. The system controller 126 is used to control the process sequence used to process the substrate 101, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing chamber 100. Typically, the software program, which is readable by CPU 133 in the system controller 126, includes code, which, when executed by the processor (CPU 133), performs tasks relating to the plasma processing methods described herein. The program may include instructions that are used to control the various hardware and electrical components within the processing chamber 100 to perform the various process tasks and various process sequences used to implement the methods described herein.

Figure 2:
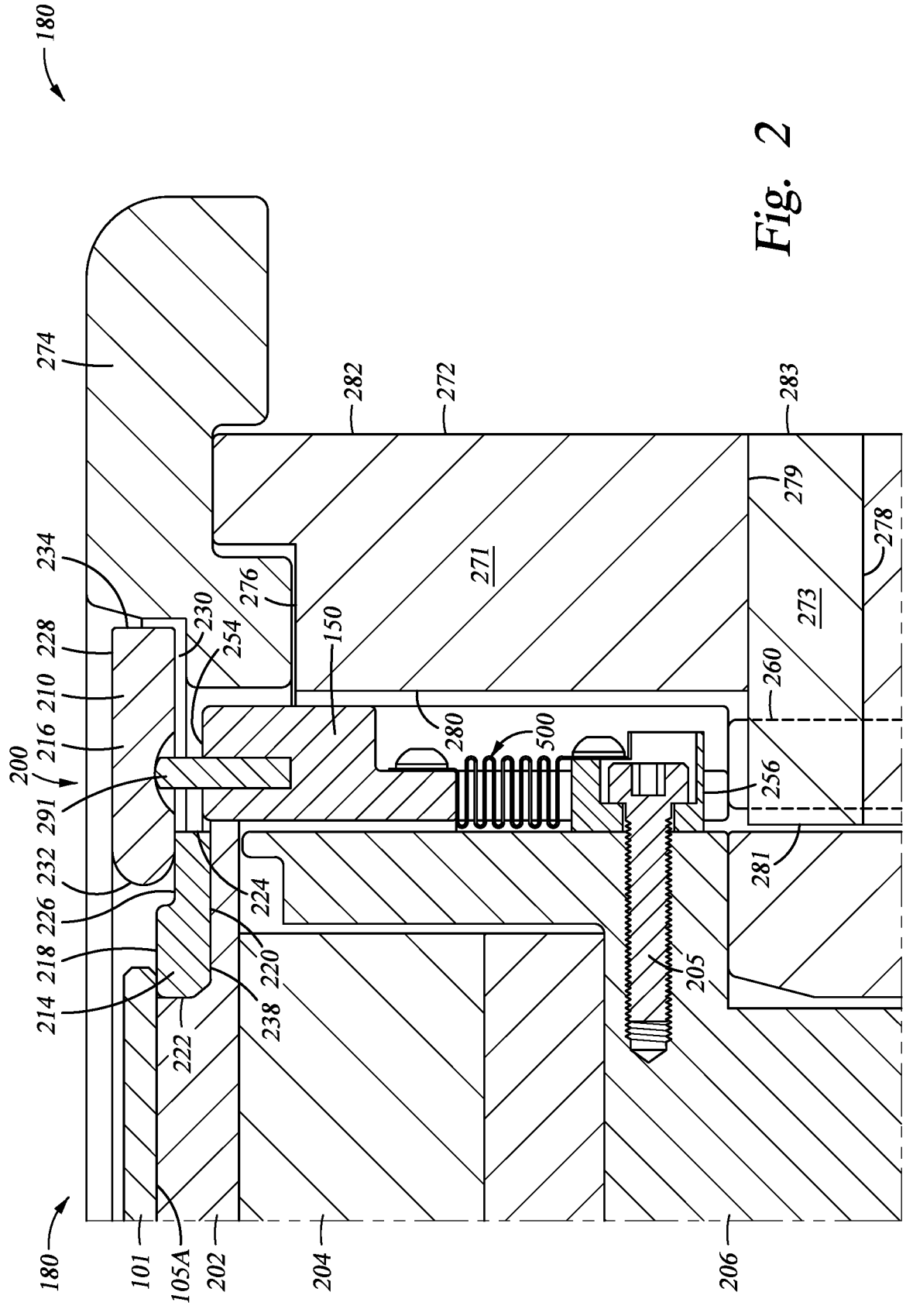
FIG. 2 is an enlarged partial cross sectional view of the support member of FIG. 1A illustrating a power coupling mechanism, according to one embodiment.

FIG. 2 is another partial cross sectional view of a portion of the substrate support assembly 180, illustrating the power coupling mechanism 500 for the process kit 200 disposed on the substrate support assembly 180, according to one embodiment. As discussed above, the substrate support assembly 180 includes the substrate support 202 (electrostatic chuck), the cooling plate 204 (or cathode), and the base 206. The cooling plate 204 is disposed on the base 206. The cooling plate 204 may include a plurality of cooling channels (not shown) for circulating coolant therethrough. The cooling plate 204 may be engaged with the substrate support 202 by an adhesive or any suitable mechanism. The substrate support 202 may include one or more heaters (not shown). The one or more heaters may be independently controllable. The one or more heaters enable the substrate support 202 to heat the substrate 101 from a bottom surface of the substrate 101 to a desired temperature.

As discussed above, the process kit 200 is supported on the substrate support assembly 180 and includes the edge ring 210, support ring 214, outer ring 274 and sliding ring 150. The support ring 214 and the edge ring 210 are interfaced with each other. The support ring 214 includes a top surface 218, a bottom surface 220, an inner edge 222, and an outer edge 224. The top surface 218 is substantially parallel to the bottom surface 220. The inner edge 222 is substantially parallel to the outer edge 224, and substantially perpendicular to the bottom surface 220. In some embodiments, the support ring 214 further includes a stepped surface 226. In the embodiment shown, the stepped surface 226 is formed in the outer edge 224, such that the stepped surface 226 is substantially parallel to the bottom surface 220. The stepped surface 226 defines a recess for receiving the edge ring 210. Generally, the height of the support ring 214 is limited by the height of the substrate support 202. For example, the inner edge 222 of the support ring 214 does not extend above the height of the substrate support 202. As such, the support ring 214 protects a side of the substrate support 202. In some embodiments, the substrate 101, when positioned on the substrate supporting surface 105A of the substrate support 202, extends partially over the support ring 214.

The edge ring 210 has a ring body 216 which includes a top surface 228, a bottom surface 230, an inner edge 232, and an outer edge 234. The top surface 228 is substantially parallel to the bottom surface 230. The inner edge 232 is substantially parallel to the outer edge 234 and substantially perpendicular to the bottom surface 230. In one embodiment, edge ring 210 is interfaced with the support ring 214 via the bottom surface 230. For example, the bottom surface 230 of edge ring 210 interfaces with the stepped surface 226 in the support ring 214. In another embodiment, the edge ring 210 may further include a stepped surface (not shown) that is formed in the inner edge 232, such that the stepped surface interfaces with the stepped surface 226 of the support ring 214. When interfaced with the support ring 214, the inner edge 232 of the edge ring 210 is spaced from the substrate 101. For example, the inner edge 232 of the edge ring 210 may be spaced between about 0.02 mm and about 0.1 mm from the substrate 101.

In one embodiment, when interfaced, the edge ring 210 and the support ring 214 forms a continuous bottom surface 238. In another embodiment, when interfaced, the support ring 214 and the edge ring 210 do not form a continuous bottom surface 238. Rather, in some embodiments, the top surface 218 of the support ring 214 may be higher than the top surface 228 of the edge ring 210. In other embodiments, the bottom surface 230 of the edge ring 210 may sit below the bottom surface 220 of the support ring 214. Thus, in some embodiments, the support ring 214 and the edge ring 210 do not form a continuous top or bottom surface.

The sliding ring 150 has a top surface 254 and a bottom surface 256. The sliding ring 150 may be formed from a conductive material, such as a metal that can include aluminum, stainless steel, copper, nickel, or other desirable conductive material. The sliding ring 150 is disposed beneath the edge ring 210. For example, the sliding ring 150 is disposed beneath the edge ring 210. The sliding ring 150 contacts the bottom surface of the 238 of the edge ring 210. Optionally, the sliding ring 150 has a conductive pin 291. The conductive pin 291 may extend through the top surface 218. In one example, the sliding ring 150 has three conductive pins 291 formed from silicon carbide (SiC). The conductive pin 291 enhances the source power conductance from the sliding ring 150 to the edge ring 210. Alternatively, the top of the sliding ring 150 may have a bare metal or thin layer of anodizing to make a flat contact with the edge ring 210 for improved conductivity between the sliding ring 150 and the edge ring 210.

Figure 3A:
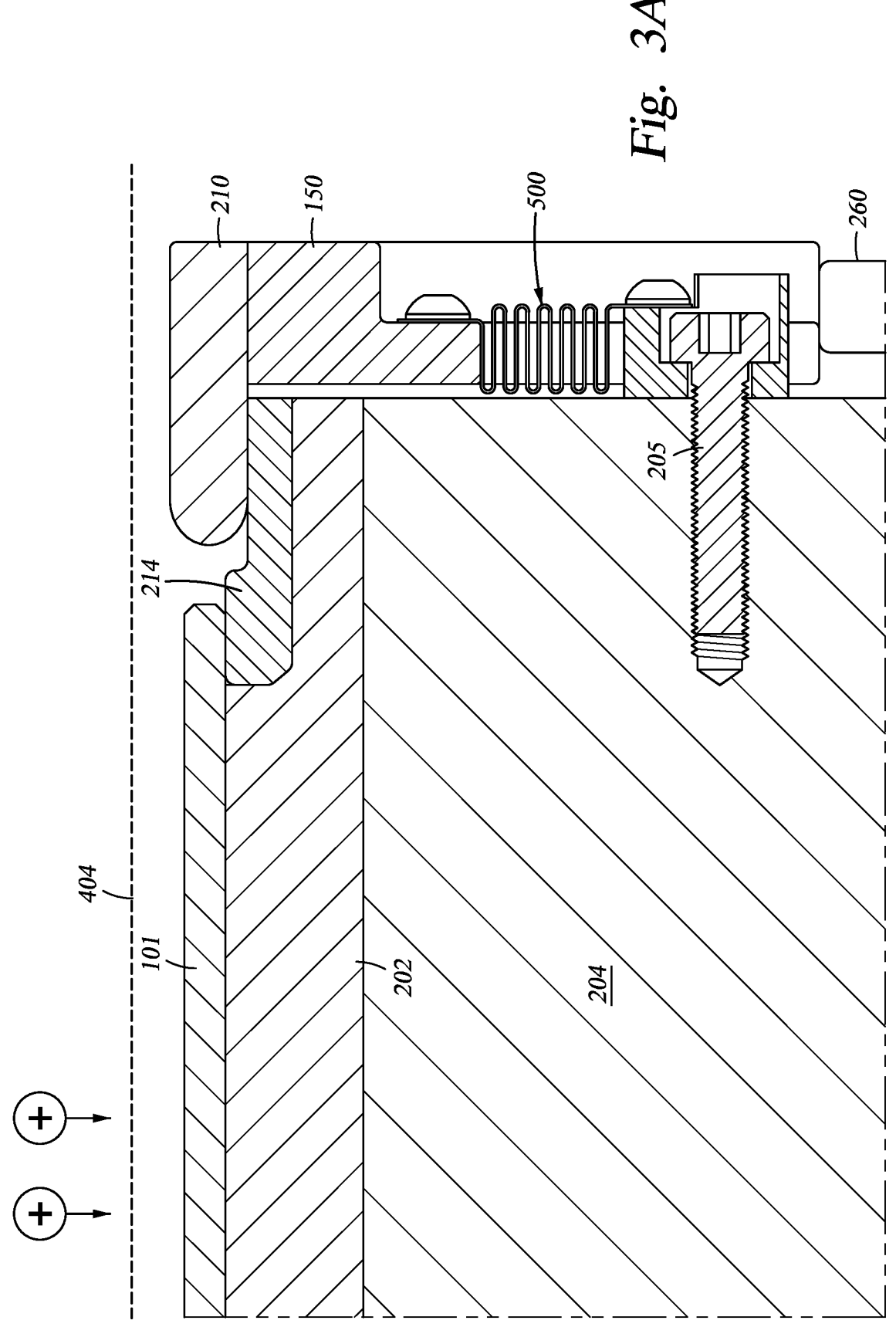
FIGS. 3A and 3B are a simplified cross sectional view of a portion of the processing chamber of FIG. 1A, according to one embodiment, illustrating an advantage of the present disclosure.
Figure 3B:
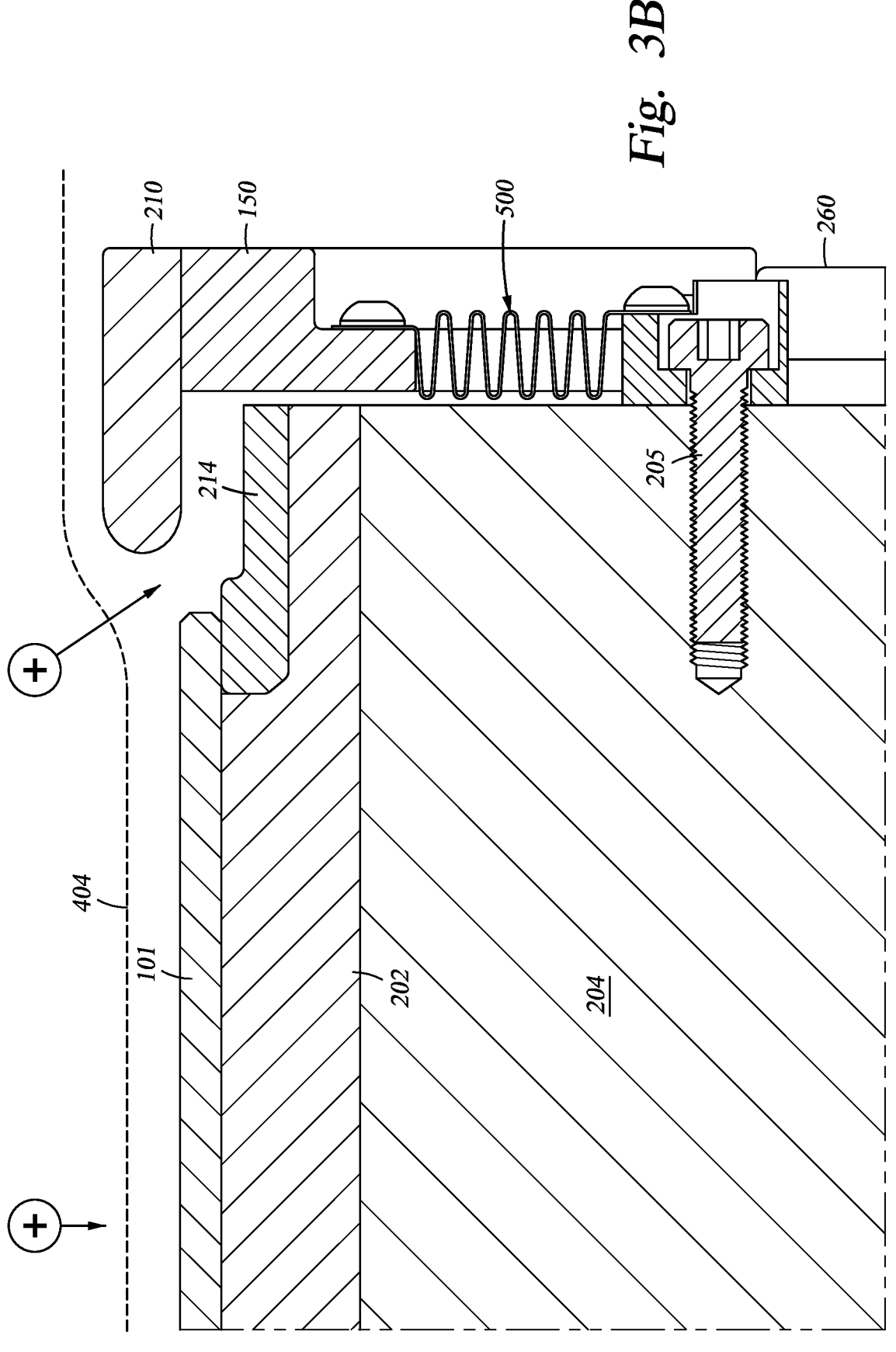
Figures 5A, 5B:
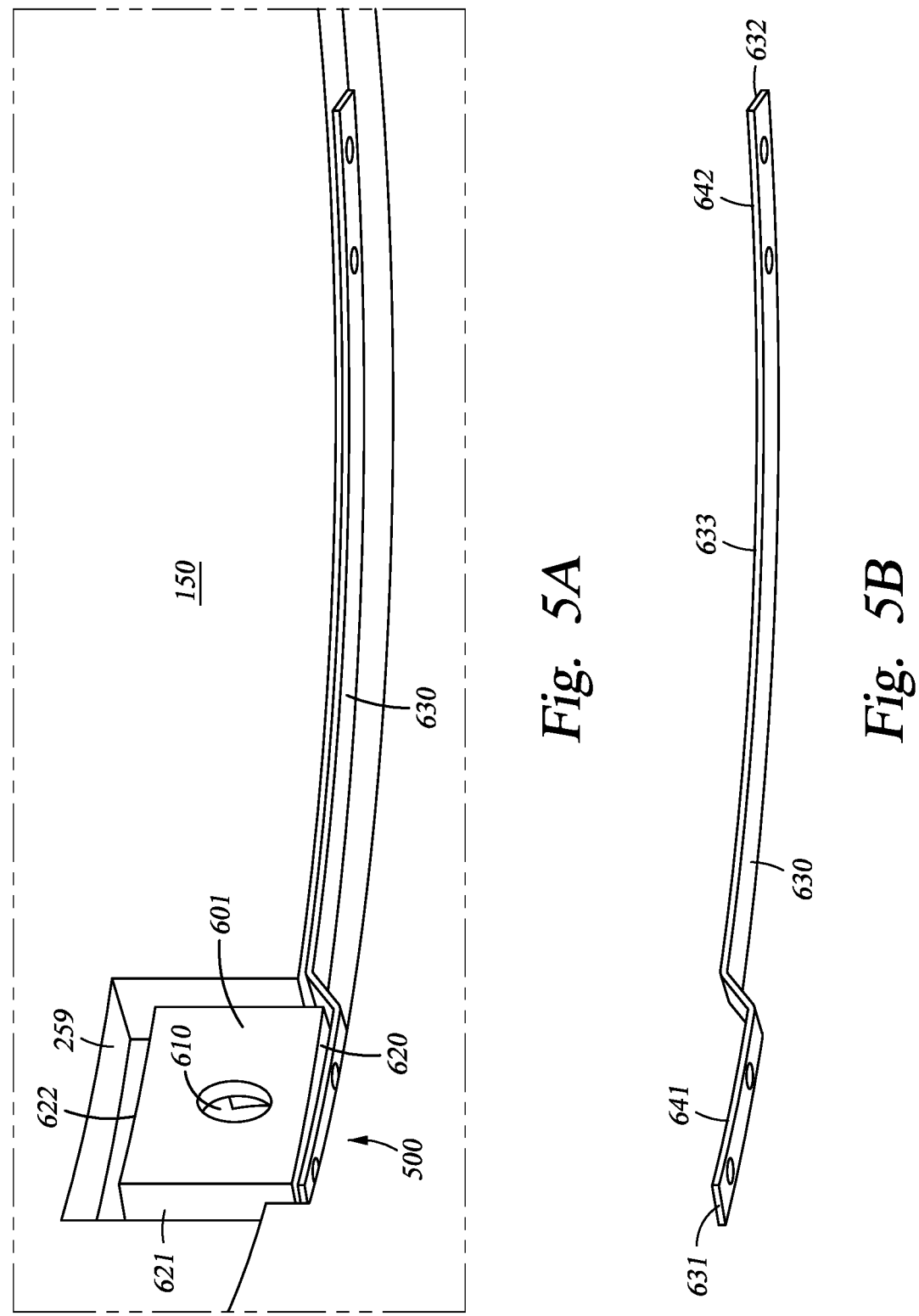
FIGS. 5A and 5B illustrate another embodiment for the power coupling mechanism.

In one embodiment, the sliding ring 150 extends down the length of the substrate support 202 and the cooling plate 204, such that the sliding ring 150 has a height substantially equal to the combined height of the substrate support 202 and the cooling plate 204. The sliding ring 150 may have a slot 259, which is better shown in FIG. 5A. FIG. 5A will be discussed later below. Continuing with FIG. 2, the slot 259 is electromechanically coupled to a power coupling mechanism 500, first shown in FIG. 3A, but also shown in other figures. In one example, the power coupling mechanism 500 is sized to move in the slot 239 of the sliding ring 150. In some embodiments, the power coupling mechanism 500 enables the sliding ring 150 to be biased by providing source power (e.g., PV waveform provided from the PV waveform generator 208A and/or DC bias provided from the DC power source in the clamping network 209) from the cooling plate 204 to the edge ring 210 as shown in FIGS. 3A and 3B. Alternately, the power coupling mechanism 500 enables the sliding ring 150 to be biased from the base 206 to the edge ring 210 as shown in FIG. 2. It should be appreciated that the power coupling mechanism 500 enables the sliding ring 150 to be electrically coupled to the cathode, for example, the cooling plate 204 or alternatively described as the base 206, or even the conductive tube 167.

The sliding ring 150 may circumscribe the cooling plate 204, thus forming a laterally spaced gap 258. In one example, the laterally spaced gap 258 is greater than 0 inches and is less than or equal to 0.03 inches. The sliding ring 150 interfaces with a lift pin 260. For example, the lift pin 260 may be operably coupled with the sliding ring 150. The lift pin 260 is driven by the actuating assembly 151, which can include a pneumatic actuator or electric motor driven actuator assembly. In some embodiments, the lift pin 260 may be driven by a lift pin actuating mechanism (not shown) independent from the actuating assembly 151. The actuating assembly 151 allows the sliding ring 150 to be moved and positioned vertically within the processing chamber 100. As a result of the vertical movement of the sliding ring 150, the actuating assembly 151 raises the edge ring 210 to one or more vertical positions that can be controlled by the system controller 126. The edge ring 210 may be raised above the support ring 214, thus forming a gap between the stepped surface of the support ring 214 and the stepped surface of the edge ring 210.

In another example, the sliding ring 150 may be moved manually, thus eliminating the need for the lift pin 260. The sliding ring 150 may include a cavity (not shown) and an access orifice formed therein. The cavity is formed down to a bottom of the sliding ring 150. The cavity is configured to house a lead screw (not shown). The lead screw may be turned to raise/lower the sliding ring 150 relative to the substrate supporting surface 105A of the substrate support 202.

The process kit 200 may further include a quartz ring 272. In one example, the quartz ring 272 is formed from an upper quartz pipe 271 and a lower quartz pipe 273. The upper quartz pipe 271 includes a top surface 276, an inner edge 280, and an outer edge 282. The lower quartz pipe 273 includes a bottom surface 278, a top surface 279, an inner edge 281 and an outer edge 283. The top surface 276 of the upper quartz pipe 271 is substantially parallel to the bottom surface 278 of the lower quartz pipe 273. The inner edge 280 of the upper quartz pipe 271 is positioned adjacent the sliding ring 150 and the edge ring 210. In one example, the top surface 279 of the lower quartz pipe 273 is adjacent the sliding ring 150. In another example, the inner edge 281 of the lower quartz pipe 273 is adjacent the sliding ring 150.

FIG. 3A is a simplified cross sectional view of a portion of the processing chamber of FIG. 1 depicting a power coupling configuration used to bias the edge ring 210 during processing, according to one embodiment. The bias power (e.g., PV waveform and/or bias provided from the clamping network 209) may be provided from the cooling plate 204, or cathode, to the edge ring 210 through the sliding ring 150. The amount of power coupled as the sliding ring 150 is improved by the power coupling mechanism 500. The power coupling mechanism 500 prevents power variation when the sliding ring 150 moves up and down by provided a electro-mechanical coupling to provide direct contact between the powered components as the DC power does not capacitive couple effectively.

Controlling the voltage $V_{DC}$, applied to the edge ring 210 such that it is constant or controlled within phases of a PV waveform pulse (e.g., ion current phase) allows for control of a plasma sheath formed over the substrate 101 and the edge ring 210. The controlled voltage, $V_{DC}$, can be used to control plasma sheath 404 profile at an edge 406 of the substrate 101 to compensate for critical dimension uniformity at the edge 406 of the substrate 101. The plasma sheath 404 is a thin region of strong electric fields formed by space charge that joins the body of the plasma to its material boundary. Mathematically, the sheath thickness, d, is represented by the Child-Langmuir equation:

$$d = \frac{2}{3}\left(\frac{\varepsilon}{i}\right)^{\frac{1}{2}}\left(\frac{2e}{m}\right)^{\frac{1}{4}}(V_p - V_{DC})^{\frac{3}{4}}$$

Where i is the ion current density, ε is the permittivity of vacuum, e is the elementary electric charge, $V_p$ is the plasma potential, and $V_{DC}$ is the DC voltage. In the case of an etch reactor, a plasma sheath 404 is formed between the plasma and the substrate 101 being etched, the chamber body 113, and every other part of the processing chamber 100 in contact with the plasma. The ions produced in a plasma are accelerated in the plasma sheath and move perpendicular to the boundary of the formed plasma sheath. Controlling the $V_{DC}$, i.e., controlling the voltage applied to the edge ring 210, affects the thickness, d, of the sheath 404. The sheath thickness, d, of sheath 404 may be measured with respect to the edge ring 210. For example, the thickness, d, is depicted in FIGS. 3A and 3B. In the embodiment shown, the actuating assembly 151 moves the sliding ring 150 upward to raise the edge ring 210. Because $V_{DC}$ remains constant due to the control of the bias applied to the edge ring 210, the sheath thickness formed over the upper surface of edge ring 210 remains constant. Therefore actuating the sliding ring 150 vertically raises the sheath 404 relative to the position of the substrate. Thus, moving the sliding ring 150 affects the shape of the sheath 404 at the substrate 101 edge 406, which in-turn controls the direction of the ions that are accelerated through the sheath and to the surface of the substrate.

FIG. 3B illustrates the portion of the processing chamber 100 of FIG. 3A, with the edge ring 210 in the raised position. As illustrated, and as discussed in FIG. 3A, raising the sliding ring 150 raises the edge ring 210, which in turn alters the shape of the plasma sheath 404 at the edge of substrate. In configurations where a constant potential, $V_{DC}$ is applied, the sheath thickness, d, and shape of plasma sheath 404 remains constant throughout the plasma process. In configurations where the bias applied to the sliding ring 150 and edge ring 210 are pulsed, the sheath thickness, d, which is controlled during the ion current phase of each pulse, is controlled so that the thickness and shape of the plasma sheath 404 remains constant throughout the primary etch portion of the PV waveform.

As discussed above, in one embodiment, to generate and maintain a bias on the edge ring 210, the sliding ring 150 is electrically coupled through the power coupling mechanism 500 to the base 206. Alternately, when the cooling plate 204 is energized, the sliding ring 150 is electrically coupled through the power coupling mechanism 500 to the cooling plate 204. That is, the base 206 or the cooling plate 204 can be configured to supply the bias to the sliding ring 150. As the sliding ring 150 is moveable with respect to both the base 206 and the cooling plate 204 of the substrate support assembly 180, the power coupling mechanism 500 is configured to provide a direct connection between the sliding ring 150 and the substrate support assembly 180. As illustrated in FIG. 2, the power coupling mechanism 500 is mechanically fastened to the base 206. For example, a fastener 205, such as a bolt, may attach the power coupling mechanism 500 mechanically fastened to the base 206. The power coupling mechanism 500 makes a physical electrical connection for which biasing voltage can travel between the sliding ring 150 and the cathode.

Figures 4A, 4B, 4C:
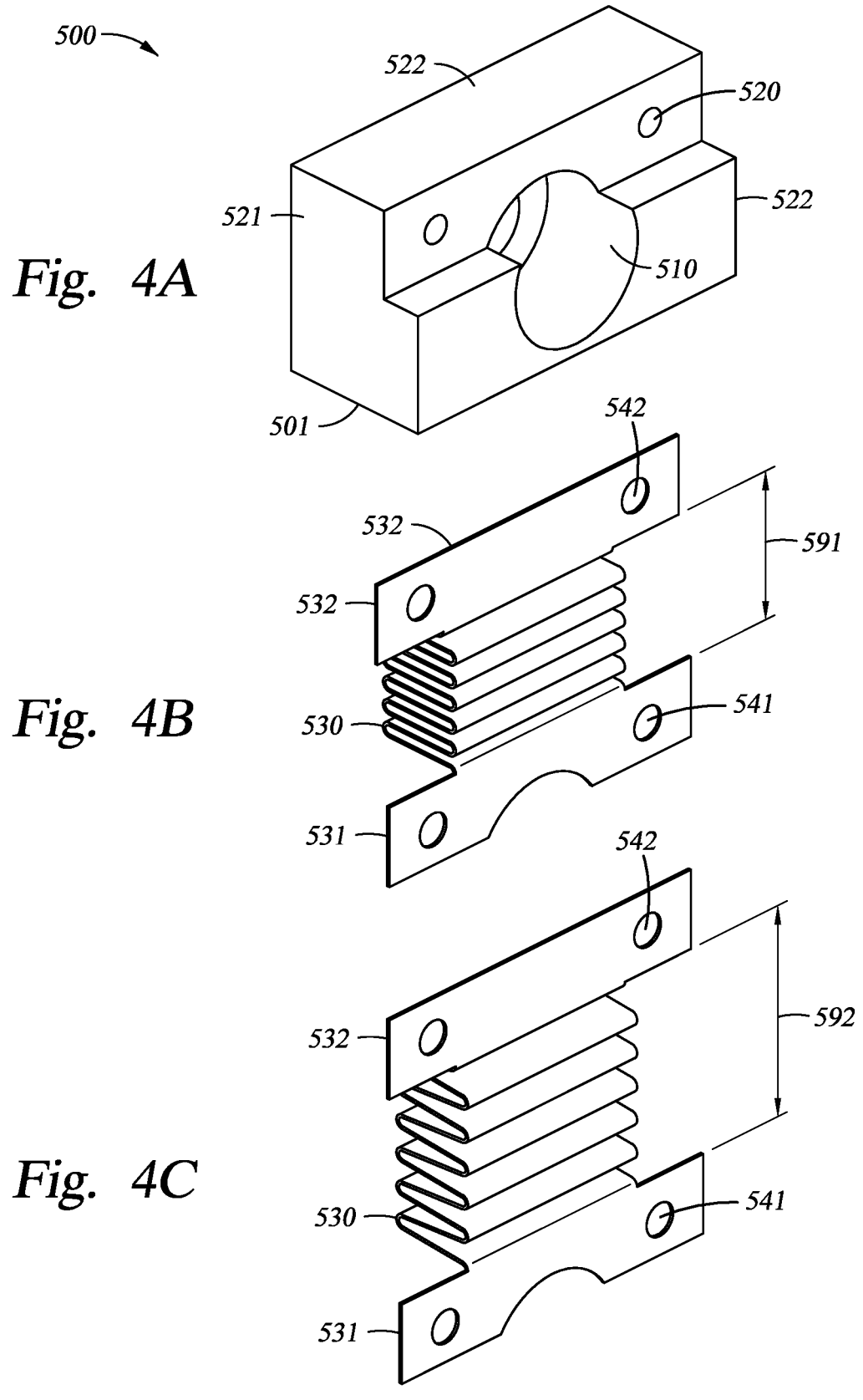
FIGS. 4A to 4C illustrate one embodiment for the power coupling mechanism.

FIGS. 4A-4C illustrate one embodiment for the power coupling mechanism 500. The power coupling mechanism 500 has a mounting block 502 and a coupling member 530. The mounting block 502 is fastened to the cathode. The coupling member 530 is attached between the mounting block 502 and the sliding ring 150. The coupling member 530 is configured to permit movement between the mounting block 502 and the sliding ring 150.

The mounting block 502 has a body 501. The body 501 has a fastener through hole 510, a side surface 521 and a top surface 522. The top surface 522 is oriented to face into from the slot 259 of the sliding ring 150 when the mounting block 502 is mounted to the cathode. The side surface 521 is oriented to face away from the cathode.

The fastener through hole 510 is configured to accept the fastener 205 for mechanically linking the body 501 of the mounting block 502 to the cathode. The fastener 205 and the body 501 of the mounting block 502 are formed of a conductive material, such as a metal, for conducting the source power to the mounting block 502. The body 501 additionally has one or more attachment points 520 for mechanically linking the mounting block 502 and the coupling member 530. The attachment points 520 are disposed on the side surface 521. Alternately, the attachment points 520 disposed on the top surface 522. The attachment points 520 may be holes suitable for fasteners. In one example, the attachment points 520 are through holes suitable for a bolt type fastener. In another example, the attachment points 520 are threaded holes suitable for accepting a screw type fastener. The attachment points 520 may alternately be a slot crimped to the coupling member 530. In yet other examples, the attachment points 520 may alternately be a weld to the coupling member 530. It should be appreciated that the attachment points 520 may be any suitable mechanism which facilitate an electro-mechanical coupling between the mounting block 502 and the coupling member 530.

The coupling member 530 has a body 533. The body 533 has first end 531 and a second end 532. The body 533 has a first attachment locations 541 at the first end 531. In one example, the first attachment locations 541 may be holes configured to align with the attachment points 520 of the coupling member 530. A bolt, screw, rivet, weld or other suitable fastener may extend through the first attachment locations 541 and attachment points 520 for electro-mechanically coupling the first end 531 of the coupling member 530 to the mounting block 502. The first attachment locations 541 is configured to interface and mechanically couple to the attachment points 520 of the coupling member 530.

The body 533 has a second attachment locations 542 at the second end 532. The second attachment locations 542 are configured to electro-mechanically couple to the sliding ring 150. For example, the sliding ring 150 may have one or more holes which align with the second attachment locations 542. A bolt, screw, rivet, weld or other suitable fastener may extend through the second attachment locations 542 and holes in the sliding ring 150 for electro-mechanically coupling the second end 532 of the coupling member 530 to the mounting block 502.

The body 533 additionally has a mid-section 555. The mid-section 555 is configured to elastically deform while maintaining electrical conductivity between the second end 532 of the body 533 and the first end 531 of the body 533. For example, the mid-section 555 may be a ribbon of metal or other conductive material. In one example, the mid-section 555 is formed from stainless steel spring with PTFE coating. The mid-section 555 is configured to permit the second end 532 of the body 533 to move relative to the first end 531 of the body 533. For example, FIG. 5B illustrates mid-section 555 the power coupling mechanism 500 in a compressed state 591. For example, FIG. 5C illustrates mid-section 555 the power coupling mechanism 500 in an extended state 592. The first end 531 is closer to the second end 532 in the compressed state 591 than in the extended state 592. Thus, the first end 531 is moveable relative to the second end 532. In this manner, the power coupling mechanism 500 permits the sliding ring 150 to move up and down while maintain an electrical connection to the source power.

FIGS. 5A and 5B illustrate another embodiment for the power coupling mechanism 500. The power coupling mechanism 500 has a mounting block 602 and a coupling member 630. The mounting block 602 is fastened to the cathode. The coupling member 630 is attached between the mounting block 602 and the sliding ring 150. In one example, the coupling member 630 is a strap. The coupling member 630 is configured to permit movement between the mounting block 602 and the sliding ring 150.

The mounting block 602 has a body 601 and a bottom surface 609. The body 601 has a fastener through hole 610. The fastener through hole 610 is configured to accept the fastener 205 for mechanically linking the body 601 of the mounting block 602 to the cathode. The fastener 205 and the body 601 of the mounting block 602 are formed of a conductive material, such as a metal, for conducting the source power to the mounting block 602. The bottom surface 609 is oriented to face away from the slot 259 of the sliding ring 150 when the mounting block 602 is mounted to the cathode.

The body 601 additionally has one or more attachment points 620 disposed on the bottom surface. The attachment points 620 are configured to mechanically link the mounting block 602 and the coupling member 630. The attachment points 620 may be holes suitable for fasteners. In one example, the attachment points 620 are through holes suitable for a bolt type fastener. In another example, the attachment points 620 are threaded holes suitable for accepting a screw type fastener. In yet other examples, the attachment points 620 may alternately be a weld to the coupling member 630. It should be appreciated that the attachment points 620 may be any suitable mechanism which facilitate an electro-mechanical coupling between the mounting block 602 and the coupling member 630.

The body 633 has a second attachment locations 642 at the second end 632. The second attachment locations 642 are configured to electro-mechanically couple to the sliding ring 150. For example, the sliding ring 150 may have one or more holes which align with the second attachment locations 642. A bolt, screw, rivet, weld or other suitable fastener may extend through the second attachment locations 642 and holes in the sliding ring 150 for electro-mechanically coupling the second end 632 of the coupling member 630 to the mounting block 602.

The body 633 additionally has a mid-section 655. The mid-section 655 is configured to elastically deform while maintaining electrical conductivity between the second end 632 of the body 633 and the first end 631 of the body 633. For example, the mid-section 655 may be a thin sheet metal plate. Alternately, the mid-section 655 may be a wire. The mid-section 655 is configured to permit the second end 632 of the body 633 to move relative to the first end 631 of the body 633. For example, the mid-section 655 may deflect or bend when the sliding ring 150 is moved. In this manner, the power coupling mechanism 600 permits the sliding ring 150 to move up and down while maintain an electrical connection to the source power.

The coupling member 630 may be formed from an aluminum material. It is contemplated that the coupling member 630 be uncoated to ensure good electrical conductivity throughout the life of the coupling member 630. In one example, the sliding ring 150 is formed from aluminum. The sliding ring 150 may be anodized along the bottom surface 256. The sliding ring 150 may additionally be yttria coated with the anodization along the bottom surface 256. The coupling member 630 is electrically connected to the sliding ring 150 through screws or other suitable fasteners. For example, the coupling member 630 is electrically connected to the mounting block 602 with screws, and the mounting block 602 is connected to the base 206 with screws 205.

Advantageously, the power coupling mechanism 500 provides a hard contact between the cathode, such as the base plate, and the sliding ring to provide sufficient DC voltage to sliding ring.

While the foregoing is directed to specific embodiments, other and further embodiments may be devised without departing from the basic scope thereof, and the scope thereof is determined by the claims that follow.

What is claimed is:

1. A process kit for a substrate processing chamber, the process kit comprising:

an edge ring configured to circumscribe a substrate in a semiconductor processing chamber;

a sliding ring positioned beneath the edge ring, the sliding ring having a top surface configured to contact a bottom surface of the edge ring;

an actuating mechanism interfaced with a bottom surface of the sliding ring, the actuating mechanism configured to move the sliding ring such that the edge ring may be moved; and a power coupling mechanism electromechanically coupled to the sliding ring and configured to electro mechanically couple to a cathode providing DC power.

2. The process kit of claim 1, wherein the sliding ring is formed from a conductive material.

3. The process kit of claim 1, wherein the sliding ring comprises:

a pin extending from a top surface.

4. The process kit of claim 1, wherein the power coupling mechanism comprises:

a mounting block configured to be fastened to the cathode; and a coupling member extending between the mounting block and the sliding ring.

5. The process kit of claim 4, wherein the sliding ring comprises:

a slot configured to accept the mounting block.

6. The process kit of claim 4, wherein the coupling member is a ribbon attached to a side of the sliding ring.

7. The process kit of claim 6, wherein the coupling member has a first end and a second end moveable relative to the first end.

8. The process kit of claim 4, wherein the coupling member is a flat plate attached to the bottom surface of the sliding ring.

9. The process kit of claim 1, wherein the sliding ring has a thin strip of metal along the top surface for contacting the edge ring.

10. A processing chamber, comprising:

a substrate support member configured to support a substrate, the substrate support member having a cathode configured to receive power from a DC power supply; and a process kit supported by the substrate support member, the process kit comprising:

an edge ring configured to circumscribe a substrate in a semiconductor processing chamber;

a sliding ring positioned beneath the edge ring, the sliding ring having a top surface configured to contact a bottom surface of the edge ring;

an actuating mechanism interfaced with a bottom surface of the sliding ring, the actuating mechanism configured to move the sliding ring such that the edge ring may be moved; and a power coupling mechanism electromechanically coupled to the sliding ring and configured to electro mechanically couple to the cathode providing DC power.

11. The processing chamber of claim 10, wherein the power coupling mechanism is a strap.

12. The processing chamber of claim 10, wherein the sliding ring is formed from a conductive material.

13. The processing chamber of claim 10, wherein the sliding ring component comprises:

a pin extending from a top surface.

14. The processing chamber of claim 10, wherein the power coupling mechanism comprises:

a mounting block configured to be fastened to the cathode; and a coupling member extending between the mounting block and the sliding ring.

15. The processing chamber of claim 14, wherein the sliding ring comprises:

a slot configured to accept the mounting block.

16. The processing chamber of claim 14, wherein the coupling member is a ribbon attached to a side of the sliding ring.

17. The processing chamber of claim 16, wherein the coupling member has a first end and a second end moveable relative to the first end.

18. The processing chamber of claim 14, wherein the coupling member is a flat plate attached to the bottom surface of the sliding ring.

19. The processing chamber of claim 10, wherein the sliding ring has a thin strip of metal along the top surface for contacting the edge ring.

20. A method of processing a substrate, comprising:

positioning the substrate on a substrate support member disposed in a substrate processing chamber;

forming a plasma above the substrate;

adjusting a height of a component of an edge ring by actuating a sliding ring interfaced with the component to change a direction of ions at an edge of the substrate; and providing DC power to the edge ring through the sliding ring, wherein the sliding ring is electro mechanically coupled to a cathode in the substrate support member.

* * * * *